US007949926B2

(12) United States Patent
Nimbalker et al.

(10) Patent No.: US 7,949,926 B2
(45) Date of Patent: *May 24, 2011

(54) METHOD AND APPARATUS FOR ENCODING AND DECODING DATA

(75) Inventors: Ajit Nimbalker, Schaumburg, IL (US);
 Yufei Wu Blankenship, Kildeer, IL (US); Brian K. Classon, Palatine, IL (US)

(73) Assignee: Motorola Mobility, Inc., Libertyville, IL (US)

( * ) Notice: Subject to any disclaimer, the term of this patent is extended or adjusted under 35 U.S.C. 154(b) by 908 days.

This patent is subject to a terminal disclaimer.

(21) Appl. No.: 11/683,024

(22) Filed: Mar. 7, 2007

(65) Prior Publication Data

US 2008/0133998 A1 Jun. 5, 2008

(51) Int. Cl.
 *H03M 13/00* (2006.01)
(52) U.S. Cl. .................. 714/755; 714/786
(58) Field of Classification Search .................. 714/755, 714/786
See application file for complete search history.

(56) References Cited

U.S. PATENT DOCUMENTS

| | | | |
|---|---|---|---|
| 6,304,991 B1 * | 10/2001 | Rowitch et al. | 714/755 |
| 6,314,534 B1 * | 11/2001 | Agrawal et al. | 714/702 |
| 6,339,834 B1 * | 1/2002 | Crozier et al. | 714/701 |
| 6,347,385 B1 * | 2/2002 | Cui et al. | 714/701 |
| 6,625,762 B1 * | 9/2003 | Le Dantec | 714/701 |
| 6,785,859 B2 * | 8/2004 | Goldman | 714/755 |
| 6,854,077 B2 * | 2/2005 | Chen et al. | 714/702 |

OTHER PUBLICATIONS

Ericsson, "Quadratic Permutation Polynomial Interleavers for LTE Turbo Coding", TDOC R1-063137 of 3GPP TSG RAN WG 1 Meeting #47, Nov. 10, 2006, pp. 1-5, Riga, Latvia.
Motorola, "Code Block Segmentation for Contention-Free Turbo Interleavers" TDOC R1-063062 of TSG RAN WG 1 Meeting #47, Nov. 10, 2006, pp. 1-4, Riga, Latvia.
Motorola, "Contention-Free Interleaver Designs for LTE Turbo Codes", TDOC R1-070054 of 3GPP TSG RAN WG 1 Meeting #47BIS, Jan. 19, 2007, pp. 1-9, Sorrento, Italy.
Rosnes E, et al, "Optimum Distance Quadratic Permutation Polynomial-based Interleavers for Turbo Codes", Proc. 2006 IEEE International Symposium on Information Theory, Jul. 9, 2006, pp. 1938-1992, Seattle, USA.

(Continued)

*Primary Examiner* — Esaw T Abraham

(57) ABSTRACT

A method and apparatus for selecting interleaver sizes for turbo codes is provided herein. During operation information block of size K is received. An interleaver size K' is determined that is related to K", where K" from a set of sizes; wherein the set of sizes comprise $K''=a^p \times f$, $p_{min} \leq p \leq p_{max}$; $f_{min} \leq f \leq f_{max}$, wherein a is an integer and f is a continuous integer between $f_{min}$ and $f_{max}$, p takes integer values between $p_{min}$ and $p_{max}$, $a>1$, $p_{max}>p_{min}$, $p_{min}>1$. The information block of size K is padded into an input block of size K' using filler bits, if needed. Encoding is performed using the original input block and the interleaved input block to obtain a codeword block using a turbo encoder. The codeword block is transmitted through the channel.

7 Claims, 4 Drawing Sheets

OTHER PUBLICATIONS

Takeshita O Y, "On Maximum Contention-Free Interleavers and Permutation Polynomials over Integer Rings", IEEE Transactions on Information Theory IEEE, Mar. 3, 2006, pp. 1249-1253, vol. 52, No. 3, USA.

Release 6 interleaver(3GPP standard turbo code 25.212 V6.4.0), Mar. 2005, pp. 16-20.

Berrou C., Saouter Y., Douillard C., Kerouedan S., Jezequel M., ?Designing good permutations for Turbo Codes: towards a single model?, in Proceedings of ICC 2004, vol. 1, pp. 341-345, Jun. 2004.

Motorola, France Telecom, GET, Orange, "EUTRA FEC Enhancement", 3GPP TSG RAN WG1#44bis, R1-061050, Mar. 27, 2006, all pages.

European Patent Office, Munich, Germany, Communication pursuant to Article 94(3) EPC, Oct. 23, 2009, all pages.

Japanese Patent Office, Analysis of the Office Action Issued on Sep. 21, 2010, all pages.

* cited by examiner

100

300

600

US 7,949,926 B2

METHOD AND APPARATUS FOR ENCODING AND DECODING DATA

RELATED APPLICATIONS

The present invention claims priority from provisional application No. 60/867899, entitled METHOD AND APPARATUS FOR ENCODING AND DECODING DATA, filed Nov. 30, 2006.

FIELD OF THE INVENTION

The present invention relates generally to encoding and decoding data and in particular, to a method and apparatus for turbo encoding and decoding.

BACKGROUND OF THE INVENTION

Digital data transmissions over wired and wireless links may be corrupted, for instance, by noise in the link or channel, by interference from other transmissions, or by other environmental factors. To combat the errors introduced by the channel, many communication systems employ error-correction techniques to aid in communication.

One technique utilized for error correction is turbo coding of an information block before it is transmitted over the channel. Utilizing such a technique, an encoder within the transmitter of a communication system will encode an input block u of length K' bits into a codeword block x of N bits. The codeword block is then transmitted over the channel, possibly after further processing such as channel interleaving as defined in the IEEE 802.16e specifications. At the receiver, the turbo decoder takes the received signal vector y of length N as input, and generates an estimate û of vector u.

Typically the turbo encoder is composed of two constituent convolutional encoders. The first constituent encoder takes the input block u as input in its original order, and the second constituent encoder takes the input block u in its interleaved order after passing u through a turbo interleaver π. The turbo encoder output x is composed of the systematic bits (equal to the input block u), the parity bits from the first constituent encoder, and the parity bits from the second constituent encoder.

Correspondingly the turbo decoder within the receiver of the communication system is composed of two constituent convolutional decoders, one for each constituent code. The constituent decoders are separated by the interleaver π and the corresponding deinterleaver $\pi^{-1}$. Messages in the format of log-likelihood ratios (LLRs) are passed between the constituent decoders iteratively. The decision û is made after several iterations.

The turbo interleaver π is the key component in the turbo code design. It is responsible for scrambling the input block u in a pseudo-random fashion, thus providing the codewords x with good weight distribution, hence good error-correcting capabilities. In addition to decoding performance, the definition of the turbo interleaver π greatly impacts the implementation of the turbo decoder within the receiver. To allow high-level of parallel processing without memory access contentions, the turbo interleaver π needs to have contention-free properties.

DETAILED DESCRIPTION OF THE DRAWINGS

Figure 1:
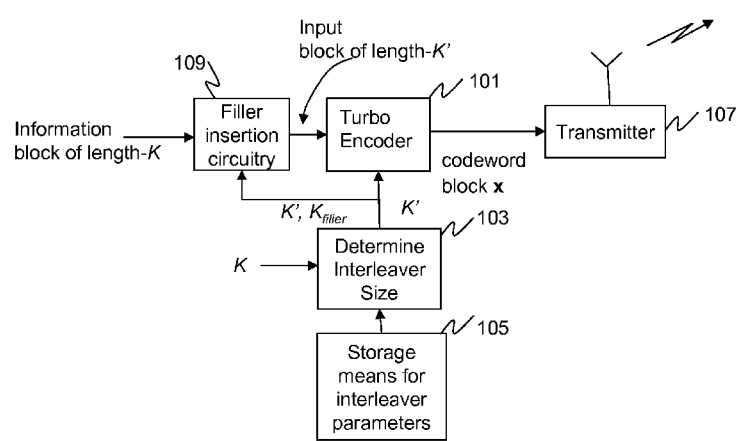
FIG. 1 is a block diagram of a transmitter.

In order to address the above-mentioned need for contention-free interleavers, a method and apparatus for selecting interleaver sizes for turbo codes is provided herein.

During operation an information block of size K is received. An interleaver size K' is determined where K' is related to K'' where K'' is from a set of sizes; wherein the set of sizes comprise $K''=a^p \times f$, $p_{min} \leq p \leq p_{max}$, $f_{min} \leq f \leq f_{max}$, wherein a is an integer, f is a continuous integer between $f_{min}$ and $f_{max}$, p takes integer values between $p_{min}$ and $p_{max}$, a>1, $p_{max}>p_{min}$, $p_{min}>1$. The information block of size K is padded into an input block of size K'. The input block is interleaved using an interleaver of size K'. The original input block and the interleaved input block are encoded to obtain a codeword block. The codeword block is transmitted through the channel.

In a further embodiment of the present invention the step of determining the interleaver size K' that is related to K'' comprise the step of using K'=K''.

In yet another embodiment of the present invention the step of determining the interleaver size K' that is related to K'' comprise the step of using K'=K'' when K'' is not a multiple of $(2^m-1)$; otherwise using $K'=K''+\delta(K'')$ when K'' is a multiple of $(2^m-1)$, wherein m is the memory length of the constituent convolutional encoder, and $\delta(K'')$ is a small positive or negative integer not equal to a multiple of $(2^m-1)$. In one embodiment m=3.

In yet another embodiment of the present invention the step of interleaving the input block comprises the step of using a permutation $\pi(i)=(iP_0+A+d(i)) \bmod K'$, where $0 \leq i \leq K'-1$ is the sequential index of the symbol positions after interleaving, π(i) is the symbol index before interleaving corresponding to position i, K' is the interleaver size in symbols, $P_0$ is a number that is relatively prime to K', A is a constant, C is a small number that divides K', and d(i) is a dither vector of the form $d(i)=\beta(i \bmod C)+P_0 \times \alpha(i \bmod C)$ where $\alpha(\cdot)$ and $\beta(\cdot)$ are vectors each of length C, periodically applied for $0 \leq i \leq K'-1$.

In yet another embodiment of the present invention the step of interleaving the input block comprises the step of using a permutation $\pi(i)=(f_1 \times i + f_2 \times i^2) \bmod K'$, where $0 \leq i \leq K'-1$ is the sequential index of the symbol positions after interleaving, π(i) is the symbol index before interleaving corresponding to position i, K' is the interleaver size in symbols, and $f_1$ and $f_2$ are the factors defining the interleaver.

Prior to describing encoding and decoding data, the following definitions are provided to set the necessary background:

K denotes the size of an information block.
K' denotes an interleaver size (i.e., input block size for which a turbo code interleaver is defined).
K'' denotes an auxiliary variable that may be used in determining an interleaver size.
$K_{filter}$ denotes the number of filler bits added to the information block.
π denotes the turbo code internal interleaver.
The flooring operation $\lfloor x \rfloor$ denotes the largest integer smaller than or equal to x and the ceiling operation $\lceil x \rceil$ denotes the smallest integer larger than or equal to x.

u denotes an input block, which has a length of K' and is sent to the turbo encoder at the transmitter. û denotes the estimated input block, which has a length of K' and is produced by the turbo decoder at the receiver. Note that û=u when there is no decoding error. Otherwise û≠u.

Turning now to the drawings, wherein like numerals designate like components, FIG. 1 is a block diagram of transmitter 100. As shown, transmitter 100 comprises filler insertion circuitry 109, turbo encoder 101, interleaver size determination circuitry 103, interleaver parameter table 105, and transmitter 107. Encoder 101 is preferably a rate-⅓ 3GPP turbo coder, however, the techniques described herein for operating encoder 101 may be applied to other encoders, including, but not limited to turbo coders performing turbo coding with tail bits or no tail bits, tail-biting, binary or duo-binary turbo coders, turbo coders using different rate-matching and puncturing techniques, . . . , etc. Circuitry 103 determines the interleaver size K' that is related to K", where K" is from a set of sizes; wherein the set of sizes comprise $K''=a^p \times f$, $p_{min} \leq p \leq p_{max}$; $f_{min} \leq f \leq f_{max}$, wherein a is an integer and f is a continuous integer between $f_{min}$ and $f_{max}$, p takes integer values between $p_{min}$ and $p_{max}$, $a>1$, $p_{max}>p_{min}$, $p_{min}>1$.

During operation of transmitter 100, information block of size K needs to be encoded by the turbo encoder 101. For some communication systems where a large number of different Ks are used, it is not efficient (and often impossible) to define a contention-free (CF) interleaver for every information block size K. It is preferable if a small set (K') of well-designed CF interleavers is able to cover all the information block sizes. Given an information block size K, a suitable interleaver size K' may be chosen by circuitry 103 from the set of available sizes (e.g., interleaver sizes listed in table 105). The information block is then padded into an input block of size K' by circuitry 109 and sent as input to the turbo encoder 101. A typical arrangement is to pad the information block with $K_{filler}$ filler bits (via filler insertion circuitry 109). Note that the term "size" and "length" are used interchangeably to indicate the number of elements in a block or vector.

Once K' is chosen by circuitry 103, it is provided to turbo encoder 101. During encoding, a contention-free interleaver may be used (not shown in FIG. 1). For instance, the interleaver can use a permutation $\pi(i)=(iP_0+A+d(i))\mod K'$, where $0 \leq i \leq K'-1$ is the sequential index of the symbol positions after interleaving, $\pi(i)$ is the symbol index before interleaving corresponding to position i, K' is the interleaver size in symbols, $P_0$ is a number that is relatively prime to K', A is a constant, C is a small number that divides K', and d(i) is a "dither" vector of the form $d(i)=\beta(i \mod C)+P_0 \times \alpha(i \mod C)$ where $\alpha(\cdot)$ and $\beta(\cdot)$ are vectors each of length C, periodically applied for $0 \leq i \leq K'-1$. As another example, the interleaver can use a permutation $\pi(i)=(f_1 \times i + f_2 \times i^2) \mod K'$, where $0 \leq i \leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. In general a symbol may be composed of multiple bits and the step of interleaving may use an additional step of permuting the bits within a symbol. Without losing generality, the discussion below considers the typical case where a symbol is composed of one bit only (thus no need of permuting bits within a symbol), and the terms "bit" and "symbol" can be used interchangeably.

The output of turbo encoder 101 comprises a codeword block x, and x is sent to transmitter 107 where it is transmitted through the channel. The transmitter may perform additional processing such as rate matching, channel interleaving, modulation, etc., before transmitting the codeword block x through the channel.

Figure 2:
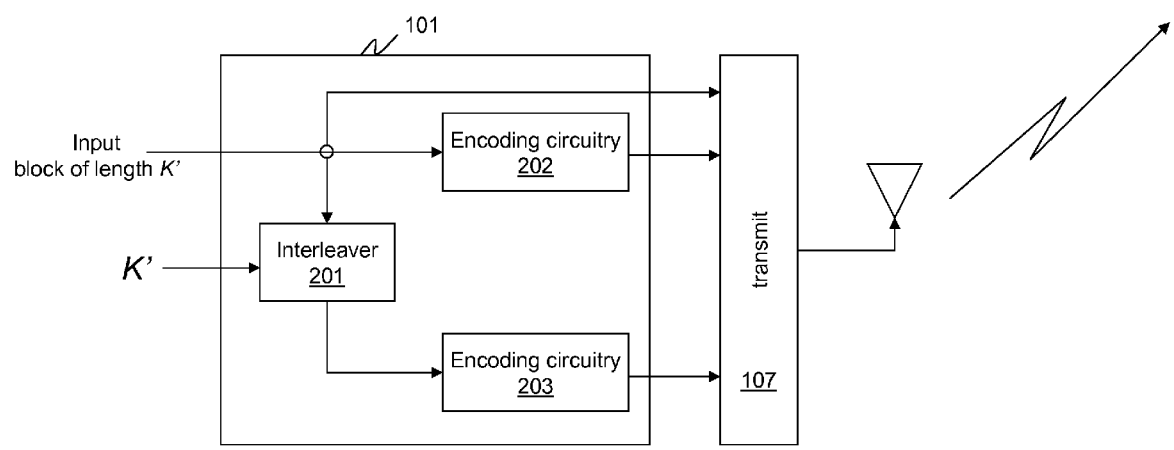
FIG. 2 is a block diagram of the turbo encoder of FIG. 1.

FIG. 2 is a block diagram of encoder 101 of FIG. 1. As shown, encoder 101 comprises interleaver 201, encoding circuitry 202, and encoding circuitry 203. An example of the encoder is the turbo coder defined in 3GPP specification. The mother code rate of the turbo coder defined in 3GPP has a native code rate of R=⅓. At the output of the turbo encoder, three bits are produced for each bit within the input block: one systematic bit (equal to the bit in the input block), one parity bit from constituent encoder 1, one parity bit from constituent encoder 2. In addition, the output of the turbo encoder may also include $N_{TB}$ tail bits, which are used to terminate the trellis of the constituent codes. For example, for 3GPP turbo code, $N_{TB}=12$ bits at the output of the turbo encoder, 6 tail bits per constituent code. On the other hand, it is possible to use tail-biting constituent convolutional codes, thus making $N_{TB}=0$.

Interleaver 201 can be a contention-free interleaver. An interleaver $\pi(i)$, $0 \leq i < K'$, is said to be contention-free for a window size W if and only if it satisfies the following constraint for both $\psi=\pi$ (interleaver) and $\psi=\pi^{-1}$ (de-interleaver), $$\left\lfloor \frac{\psi(j+tW)}{W} \right\rfloor \neq \left\lfloor \frac{\psi(j+vW)}{W} \right\rfloor \quad (1)$$

where $0 \leq j < W$, $0 \leq t$; $v < M(=K'/W)$, and $t \neq v$. Though it is not always necessary, for efficient turbo decoder design, typically all the M windows are full, where K'=MW. The terms in (1) are the memory bank addresses that are concurrently accessed by the M processors when writing the extrinsic values to the output memory banks during iterative decoding. If these memory bank addresses are all unique during each read and write operations, there are no contentions in memory access and hence the (de)interleaving latency can be avoided, leading to a high speed decoder implementation.

During operation of turbo encoder 101, input block of length K' bits enters both interleaver 201 and encoding circuitry 202. Interleaver 201 can be a contention-free interleaver of size K'.

Interleaver 201 interleaves the input block and passes the input block in interleaved order to encoding circuitry 203. Encoding circuitry 203 then encodes the interleaved input block. In a similar manner, encoding circuitry 202 encodes the original input block. The codeword block x is composed of systematic block (equal to the input block), output of encoding circuitry 202, and output of encoding circuitry 203. The codeword block x is then sent to transmitter 107 which can also receive a copy of the input block directly.

As an example of the contention-free interleaver, an almost regular permutation (ARP) interleaver is given by the following expression $$\pi(i)=(iP_0+A+d(i))\mod K'$$

where $0 \leq i \leq K'^{-1}$ is the sequential index of the bit positions after interleaving, $\pi(i)$ is the bit index before interleaving corresponding to position i, K' is the interleaver size, $P_0$ is a number that is relatively prime to K', A is a constant, C is a small number that divides K', and d(i) is a dither vector of the form $d(i)=\beta(i \mod C)+P_0 \times \alpha(i \mod C)$ where $\alpha(\cdot)$ and $\beta(\cdot)$ are vectors each of length C, periodically applied for $0 \leq i \leq K'-1$. Both $\alpha(\cdot)$ and $\beta(\cdot)$ are composed of multiples of C. The overall interleaver $\pi(\cdot)$ thus constructed has quasi-cyclic (i.e., periodic) properties with period C, and when used in tail-biting turbo codes, the turbo code itself becomes quasi-cyclic leading to a simplified code design procedure.

As another example of the contention-free interleaver, a Quadratic Permutation Polynomial (QPP) interleaver is given by the following expression $\pi(i)=(f_1 \times i + f_2 \times i^2) \mod K'$, where $0 \leq i \leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. Similar to ARP interleavers, the turbo code is also quasi-cyclic if tail-biting.

If interleaver 201 can satisfy (1) for various values of M, then the decoder can be implemented using various degrees of parallelism (one for each M). Thus it is desirable to choose K' that has various factors. For an ARP interleaver of length K', any window size W, where W is a multiple of C and a factor of K' can be used for high-speed decoding without memory access contentions. With a different definition of parallel windows, it is possible to use any factor of K as the number of parallel windows. For a QPP interleaver, every factor of the interleaver size K' is a possible level of parallelism M. This provides flexibility and scalability in decoder design by allowing a wide range of parallelism factors M. Thus, a good compromise between decoding speed and complexity can be made based on system (or classes of user elements) requirements.

Choosing Interleaver Size K':

As discussed above, interleaver size determination circuitry 103 needs to determine an interleaver size K' for a given K. This section describes a way of selecting a limited number of sizes (i.e., K') for which turbo code interleavers may be defined. As indicated previously, filler insertion circuitry (along with puncturing or rate-matching methods) may be used to handle any information block size K. In general, the interleaver size selection must take into consideration the decoding burden and performance degradation due to the filler bits.

The number of filler bits $K_{filler}$ padded to an information block to form an input block is desirable to be limited to a small percent (e.g., around 10-13%) of the information block size K. This is achieved by limiting the difference between adjacent interleaver sizes, i.e., adjacent K' values (assuming all available K' values are sorted in ascending order). The number of filler bits are minimized by choosing the smallest K' available such that $K' \leq K$. The number of filler bits is $K_{filler} = K' - K$. However, other available values of $K' \geq K$ may also be chosen, if desired.

Consider the following set of sizes defined to cover information sizes between $K_{min}$ and $K_{max}$.

$$K''=a^p \times f, p_{min} \leq p \leq p_{max}, f_{min} \leq f \leq f_{max}, \quad (2)$$

where a is an integer, f is a continuous integer between $f_{min}$ and $f_{max}$, and p takes integer values between $p_{min}$ and $p_{max}$, $a>1$, $p_{max}>p_{min}$, $p_{min}>1$. Although not necessary, one can choose these parameters such that $K_{min}=a^{p_{min}} \times f_{min}$, and $K_{max}=a^{p_{max}} \times f_{max}$, while discarding any sizes that may not be needed. This method of selecting a limited set of sizes to cover a range of information block sizes is referred to as semi-log slicing. For a given information block of size K, a size K' is related to a K'' based on the semilog-slicing table, and information block size K.

The semilog slicing is similar to the companding operation employed in compressing signals of large dynamic range, for example, A-law and mu-Law companders used in speech codecs. The semilog slicing rule allows an efficient design to cover a wide-range of information block sizes.

Of the several ways of choosing the parameters, one way of choosing $f_{min}$ and $f_{max}$ values is to let K'' values resulting from adjacent p line up with each other, i.e., $a^p \times (f_{max}+1)=a^{p+1} \times f_{min}$, thus $$f_{max}=a \times f_{min}-1$$

For a given value of p, the separation between two adjacent block sizes K'' is given by $a^p$, which means that a maximum of $a^p-1$ filler bits are added if the information block size K is in group p and the interleaver size is equal to K''. Thus, the fraction of filler bits $K_{filler}$ over the information block size K is bounded as shown below, which occurs when the block size K is slightly greater than the size given by (p, $f_{min}$), and K'=K'' given by (p,$f_{min}$+1) is used, $$\max\left(\frac{K_{filler}}{K}\right) = \frac{a^p - 1}{a^p \times f_{min} + 1}$$
$$\leq \frac{1}{f_{min}}$$
$$= \frac{a}{(f_{max} + 1)}.$$

Alternatively, K'' values resulting from adjacent p can line up with each other via $a^p \times f_{max}=a^{p+1} \times (f_{min}-1)$, resulting in $f_{max}=a \times (f_{min}-1)$. This would give a similar $K_{filler}/K$ bound. Therefore, the parameters for the semi-log slicing can be tuned according to the range of block sizes to be supported, and also on the tolerable fraction of filler bits. The choice of $f_{min}$ requires a balance between the following two requirements:

$f_{min}$ should be large to reduce the fraction of the filler bits;
$f_{min}$ should be small to limit the size of the interleaver table, since the number of block sizes defined for each p is $f_{max}-f_{min}+1=(a-1) \times f_{min}$, assuming $f_{max}=a \times f_{min}-1$.

The semi-log slicing method is very simple in that for any block size, the interleaver size K' to be used may be easily determined based on a K'' computed from (2). Once the semilog slice sizes are defined (K''), the interleaver size K' may be obtained from the semilog slice sizes (without deviating substantially) by, for example, 1. Using K'=K''. In other words, the semilog slice sizes may be used as valid interleaver sizes directly.
2. Using K'=K'' when K'' is not a multiple of $(2^m-1)$, otherwise using $K'=K''+\delta(K'')$ when K'' is a multiple of $(2^m-1)$, wherein m is a memory length of a constituent convolutional encoder, and $\delta(K'')$ is a small positive or negative integer not equal to a multiple of $(2^m-1)$. This is helpful if the constituent convolutional codes are tail-biting, where multiples of $(2^m-1)$ are invalid. The sizes defined by the semi-log slicing method of (2) may sometimes include sizes that are unsuitable interleaver sizes for turbo coding. For example, the tail-biting version of the eight-state 3GPP turbo encoder (m=3) does not support input block sizes (i.e., interleaver sizes) that are multiples of 7 (i.e., $2^m-1$). In such cases, whenever equation (2) results in a size that is multiple of $2^m-1$, a small value is subtracted or added to it so that the resulting size is no longer a multiple of $2^m-1$.

For example, if a=2, $f_{min}=8$, and $f_{max}=15$, then interleaver sizes of the form $K'=K''=2^p \times 14$ are multiples of 7, and hence are invalid interleaver sizes when using tail-biting 3GPP TC. Therefore, this case must be handled with slight alteration, e.g., using K'=K'' is not a multiple of 7, otherwise using $K'=K''+\delta(K'')$ when K'' is a multiple of 7, and $\delta(K'')$ is a small positive or negative integer not equal to a multiple of 7.

For the K" sizes that are invalid choice for tailbiting interleavers, one simple way to determine a related interleaver size K' is by subtracting (addition is just as valid) d×C from K", where d is a small positive integer and d is not a multiple of 7. For an ARP interleaver, C may be an ARP interleaver cycle length used for the block sizes next to K' in the set of available sizes. (Recall that the block size of an ARP interleaver is a multiple of the cycle lengths C.) In other words, $$K'=K''-dC \quad (3)$$

or $$K'=K''+dC \quad (4)$$

when K" is a multiple of 7. Since C is normally an even integer, such as, 4, 8, 12, or 16, this adjustment gives two advantages, namely, (a) K' is not a multiple of 7, and (b) K' is a multiple of C and hence an ARP interleaver for size K' can be designed.

For simplicity, the same d can be chosen for all K" that need to be adjusted. One important consideration for choosing d is that it should be such that all sizes obtained by (3) or (4) have a substantial number of factors, which allows supporting a wide range of parallelism for the CF interleaver thus defined.

Example of Interleaver Size Selection:

For 3GPP LTE, it is not essential to define CF interleaver for each block size between 40 and 5114 bits. A limited or a small set of well-designed CF interleavers is sufficient to cover all the block sizes. For undefined block sizes (i.e., for which CF interleavers are not defined), zero-padding (i.e., appending filler bits) can be used effectively, as described above.

As a first example, a set of interleavers suitable to cover information block sizes for 3GPP Long Term Evolution (LTE) in table 105 are defined based on the semi-log slicing method described above. Specifically, $$K''=2^p \times f, p=4,5,\ldots,9; f=8,9,\ldots,15, \quad (5)$$

and K' is determined from K". The interleaver sizes are determined as follows: using K'=K" and for p=4,5,6,7,8,9 and f=8,9,10,11,12,13,15, and using K'=K"−dC for p=4,5,6,7,8,9 and f=14, covering K from 128 to 7680. The last three sizes (f=13, 14, 15) corresponding to p=9 may be removed such that $K_{max}=6144$, with $K_{min=128}$. Equation (3) is used along with d=2 when f=14 (i.e., to avoid interleaver sizes that are multiples of 7) in order to handle tail-biting TC. Once the interleaver sizes in 105 are determined, a CF interleaver may be designed for each interleaver size.

Given any information block size K, the circuitry 103 can determine the interleaver size K' to be used for K by choosing the smallest value of K' from 105 that is greater than or equal to K. With K known, and $f_{min}=2^b, f_{max}=2^{b+1}-1$, where b is an integer, the parameters p and f can be calculated as follows, $$p=\lfloor \log_2(K) \rfloor - b \quad (6)$$

$$f = \left\lceil \frac{K}{2^p} \right\rceil \quad (7)$$

In particular, for the parameters in (5), b=3, and $$p=\lfloor \log_2(K) \rfloor - 3 \quad (8)$$

With the parameters p and f, the block size K' can be calculated using (2) or (5), and moreover, when f is a multiple of 7 and tail-biting encoding is used, interleaver size calculated using (3) or (4) may be used in addition. The parameters associated with the interleaver of size K' is then looked up from the storage means for interleaver parameter 105, which is normally stored in memory for the communication device.

As a second example, a suggested set of complete interleaver sizes K' for covering K from 40 to 8192 bits are:

For K'∈[264, 8192], K'=$2^p$×f, p=3, ..., 7; f=33, 34, ..., 64,;
For K' below 264, a step size of 8 is used such that K'=40, 48, ..., 256.

These sizes are also listed below.

| 40 | 48 | 56 | 64 | 72 | 80 | 88 | 96 | 104 | 112 |
|---|---|---|---|---|---|---|---|---|---|
| 120 | 128 | 136 | 144 | 152 | 160 | 168 | 176 | 184 | 192 |
| 200 | 208 | 216 | 224 | 232 | 240 | 248 | 256 | 264 | 272 |
| 280 | 288 | 296 | 304 | 312 | 320 | 328 | 336 | 344 | 352 |
| 360 | 368 | 376 | 384 | 392 | 400 | 408 | 416 | 424 | 432 |
| 440 | 448 | 456 | 464 | 472 | 480 | 488 | 496 | 504 | 512 |
| 528 | 544 | 560 | 576 | 592 | 608 | 624 | 640 | 656 | 672 |
| 688 | 704 | 720 | 736 | 752 | 768 | 784 | 800 | 816 | 832 |
| 848 | 864 | 880 | 896 | 912 | 928 | 944 | 960 | 976 | 992 |
| 1008 | 1024 | 1056 | 1088 | 1120 | 1152 | 1184 | 1216 | 1248 | 1280 |
| 1312 | 1344 | 1376 | 1408 | 1440 | 1472 | 1504 | 1536 | 1568 | 1600 |
| 1632 | 1664 | 1696 | 1728 | 1760 | 1792 | 1824 | 1856 | 1888 | 1920 |
| 1952 | 1984 | 2016 | 2048 | 2112 | 2176 | 2240 | 2304 | 2368 | 2432 |
| 2496 | 2560 | 2624 | 2688 | 2752 | 2816 | 2880 | 2944 | 3008 | 3072 |
| 3136 | 3200 | 3264 | 3328 | 3392 | 3456 | 3520 | 3584 | 3648 | 3712 |
| 3776 | 3840 | 3904 | 3968 | 4032 | 4096 | 4224 | 4352 | 4480 | 4608 |
| 4736 | 4864 | 4992 | 5120 | 5248 | 5376 | 5504 | 5632 | 5760 | 5888 |
| 6016 | 6144 | 6272 | 6400 | 6528 | 6656 | 6784 | 6912 | 7040 | 7168 |
| 7296 | 7424 | 7552 | 7680 | 7808 | 7936 | 8064 | 8192 | | |

Note that the sizes shown above are only an example defined for a maximum K' of 8192 bits and used in the comparison study of the 42 information block sizes. If other maximum such as 6144 bits are used, then any K' greater than the maximum will be removed from the list. Also, for simplicity, the sizes did not consider the difference between using tailed or tail-biting constituent codes. If the turbo encoder is made tail-biting, then the K's that are multiples of 7 cannot be used. These will be either removed or modified as described earlier. Finally, additional interleaver sizes may be added to those above to decrease the spacing between interleavers. For example, if a maximum spacing of 64 is used, extra interleavers will be defined in between the interleavers with spacing 128 in the table. If tailbiting is then used and K' multiple of 7 removed, the maximum spacing is then again 128.

As yet another example of interleaver size selection, the system may use a CF interleaver only when the transport block (TB) (number of information bits preior to segmentation) is above a certain value. For example, if the maximum defined size is 5114, when a transport block is greater than 5114 a CF interleaver such as ARP or QPP may be used. In these cases, segmentation may create K' less than 5114, but the CF interleaver is used for that K'. A K may therefore both be turbo interleaved using a first interleaver (such as a 3gpp, non-CF interleaver, or other interleaver) and a second interleaver (such as a contention free interleaver), depending on the transport block size prior to segmentation. The first and second interleaver may have different sets of K'. For example, the first interleaver may be substantially defined for all K=K', while the second interleaver is defined with K' as above. In some cases, a single or fewer processors may be used for the first interleaver.

Example of ARP Interleaver:

A subset of 42 CF ARP interleavers suitable to cover information block sizes for 3GPP Long Term Evolution (LTE) is shown in Table 1. The cycle length C=4 is used for K<1024, C=8 for K≧1024. A larger cycle length C leads to better minimum distance $d_{min}$ at larger block sizes. Also, instead of A=3, A=0 is used for all the sizes. In addition, instead of allowing each K to have a different α(·) and β(·) vector, only a small set of α and β values are allowed to reduce storage of the interleaver definition. The set of allowed α and β values are defined below.

When cycle length C=4, $$\alpha = \begin{bmatrix} 0 & 0 & 4 & 4 \\ 0 & 4 & 4 & 0 \end{bmatrix};$$

$$\beta = \begin{bmatrix} 0 & 4 & 12 & 8 \\ 0 & 12 & 24 & 8 \\ 0 & 24 & 8 & 12 \\ 0 & 16 & 8 & 4 \\ 0 & 12 & 24 & 4 \\ 0 & 12 & 16 & 24 \\ 0 & 8 & 20 & 24 \\ 0 & 4 & 8 & 12 \end{bmatrix};$$

When cycle length C=8, $$\alpha = \begin{bmatrix} 0 & 0 & 8 & 0 & 8 & 0 & 8 & 8 \\ 8 & 0 & 8 & 8 & 8 & 0 & 0 & 0 \end{bmatrix};$$

$$\beta = \begin{bmatrix} 0 & 16 & 24 & 88 & 64 & 8 & 32 & 40 \\ 0 & 64 & 136 & 160 & 48 & 192 & 24 & 120 \\ 0 & 24 & 80 & 40 & 16 & 96 & 64 & 32 \\ 0 & 8 & 72 & 40 & 88 & 48 & 32 & 96 \\ 0 & 16 & 88 & 96 & 56 & 24 & 48 & 64 \\ 0 & 8 & 48 & 32 & 64 & 88 & 40 & 56 \\ 0 & 32 & 8 & 56 & 80 & 16 & 72 & 48 \\ 0 & 72 & 64 & 48 & 88 & 8 & 184 & 248 \\ 0 & 16 & 48 & 24 & 8 & 32 & 40 & 88 \\ 0 & 16 & 120 & 152 & 24 & 216 & 64 & 240 \\ 0 & 32 & 176 & 216 & 136 & 64 & 224 & 248 \\ 0 & 16 & 40 & 96 & 88 & 80 & 32 & 48 \\ 0 & 24 & 208 & 112 & 224 & 168 & 184 & 48 \\ 0 & 8 & 16 & 64 & 24 & 48 & 80 & 32 \\ 0 & 8 & 40 & 16 & 96 & 80 & 56 & 88 \end{bmatrix};$$

Thus each row of α could be used as an α vector, each row of β can be used as a $\overline{\beta}$ vector. The index a and b are therefore defined for each K' to index into the rows of α and β, where 1<=a<=2, 1<=b<=2C. The indexing method substantially reduces the storage of the ARP interleaver since only $P_0$ (8 bits), index a (1 bit) and b (3-4 bits) needs to be stored per interleaver. The cycle length C can be determined based on if K is less than 1024 bits. In addition, the amount of parameter storage for using C=8 vs C=4 is only the difference in the size of α and β matrix, which is trivial, therefore allowing the freedom to use higher C if necessary.

Storage means for interleaver parameter 105 may store ARP interleaver parameters using the values of K', C, $P_0$, α(·) and β(·) that are taken from at least one row of Table 1. The interleaver 201 may use an ARP interleaver with the values of K', C, $P_0$, α(·) and β(·) that are taken from at least one row of the following table:

TABLE 1

Parameters of the set of ARP interleavers defined for LTE. A constant offset A = 0 is used for all sizes.

| K' | C | $P_0$ | index a | index b |
|---|---|---|---|---|
| 40 | 4 | 41 | 1 | 6 |
| 56 | 4 | 13 | 1 | 1 |
| 72 | 4 | 13 | 1 | 4 |
| 88 | 4 | 75 | 2 | 3 |
| 104 | 4 | 23 | 1 | 1 |
| 120 | 4 | 73 | 1 | 8 |
| 136 | 4 | 11 | 1 | 6 |
| 152 | 4 | 129 | 1 | 5 |
| 168 | 4 | 25 | 1 | 4 |
| 192 | 4 | 43 | 1 | 1 |
| 216 | 4 | 133 | 1 | 1 |
| 248 | 4 | 57 | 2 | 6 |
| 280 | 4 | 33 | 2 | 1 |
| 320 | 4 | 207 | 1 | 4 |
| 368 | 4 | 87 | 2 | 3 |
| 384 | 4 | 91 | 1 | 1 |
| 416 | 4 | 77 | 1 | 1 |
| 472 | 4 | 61 | 1 | 4 |
| 544 | 4 | 237 | 1 | 1 |
| 624 | 4 | 49 | 1 | 7 |
| 704 | 4 | 43 | 1 | 4 |
| 800 | 4 | 151 | 1 | 1 |
| 912 | 4 | 49 | 1 | 1 |
| 1056 | 8 | 217 | 2 | 1 |
| 1184 | 8 | 49 | 1 | 11 |
| 1344 | 8 | 253 | 2 | 2 |
| 1536 | 8 | 187 | 2 | 8 |
| 1728 | 8 | 65 | 1 | 3 |
| 1984 | 8 | 121 | 1 | 14 |
| 2240 | 8 | 137 | 2 | 6 |
| 2304 | 8 | 193 | 1 | 4 |
| 2560 | 8 | 157 | 1 | 3 |
| 2944 | 8 | 121 | 1 | 7 |
| 3328 | 8 | 137 | 2 | 1 |
| 3776 | 8 | 119 | 1 | 3 |
| 4096 | 8 | 169 | 2 | 11 |
| 4352 | 8 | 179 | 1 | 3 |
| 4992 | 8 | 211 | 1 | 3 |
| 5632 | 8 | 237 | 1 | 7 |
| 6144 | 8 | 253 | 2 | 13 |
| 7296 | 8 | 181 | 1 | 7 |
| 8192 | 8 | 203 | 1 | 7 |

Properties of the ARP Interleaver:

There are several ways to modify the interleaver table. For example, storage can be reduced by using a set of ARP parameters that apply to more than one interleaver size. For example, the 1024-bit, 2048-bit, 4096-bit interleavers can all use the same ARP parameters. In another variation, some of the rows of the table may be redesigned based on different C values, if needed. In another enhancement, some of the entries of the parameters (e.g., α(0) and β(0)) may be fixed (e.g., always zero).

Following are some further comments on the interleaver selection procedure used to obtain Table 1.

1. A constant Offset value A=3 or A=0 is chosen for reducing storage.
2. Based on performance study and storage, a cycle length C=4 is used for K'<1024, C=8 for K'≧1024.
3. For each block size, simulations were performed to make sure the ARP interleaver performance (with tail-biting encoding) is near to or better than the performance with the interleaver defined in the specification for 3GPP Turbo code.
4. Table 1, based on (5) was defined to cover a particular set of interleaver sizes (e.g., 40 to 8192). If preferred, other interleaver sizes can be deleted or added.
5. All the interleavers defined in 105 that are not multiples of 7 can be used for either tailed or tail-biting turbo codes depending upon the permissible performance degradation. Those that are multiples of 7 can also be used tailed.
Example of QPP Interleaver:

A subset of 42 CF QPP interleavers suitable to cover information block sizes for 3GPP Long Term Evolution (LTE) is shown in Table 2. These interleavers have a quadratic inverse polynomial such that the deinterleaver is also QPP.

Storage means for interleaver parameter 105 may store QPP interleaver parameters using the values of K', $f_1$, $f_2$ that are taken from at least one row of Table 2. The interleaver 201 may use a QPP interleaver with the values of K', $f_1$, $f_2$ that are taken from at least one row of the following table:

TABLE 2

Parameters of the set of QPP interleavers defined for LTE.

| K' | $f_1$ | $f_2$ |
|---|---|---|
| 40 | 37 | 20 |
| 56 | 19 | 42 |
| 72 | 19 | 60 |
| 88 | 5 | 22 |
| 104 | 45 | 26 |
| 120 | 103 | 90 |
| 136 | 19 | 102 |
| 152 | 135 | 38 |
| 168 | 101 | 84 |
| 192 | 85 | 24 |
| 216 | 13 | 36 |
| 248 | 33 | 62 |
| 280 | 103 | 210 |
| 320 | 21 | 120 |
| 368 | 25 | 138 |
| 384 | 25 | 240 |
| 416 | 77 | 52 |
| 472 | 175 | 118 |
| 544 | 35 | 68 |
| 624 | 41 | 234 |
| 704 | 155 | 44 |
| 800 | 207 | 80 |
| 912 | 85 | 114 |
| 1056 | 229 | 132 |
| 1184 | 217 | 148 |
| 1344 | 211 | 252 |
| 1536 | 71 | 48 |
| 1728 | 127 | 96 |
| 1984 | 185 | 124 |
| 2240 | 209 | 420 |
| 2304 | 253 | 216 |
| 2560 | 39 | 240 |
| 2944 | 231 | 184 |
| 3328 | 51 | 104 |
| 3776 | 179 | 236 |
| 4096 | 95 | 192 |
| 4352 | 477 | 408 |
| 4992 | 233 | 312 |
| 5632 | 45 | 176 |
| 6144 | 263 | 480 |
| 7296 | 137 | 456 |
| 8192 | 417 | 448 |

Figure 3:
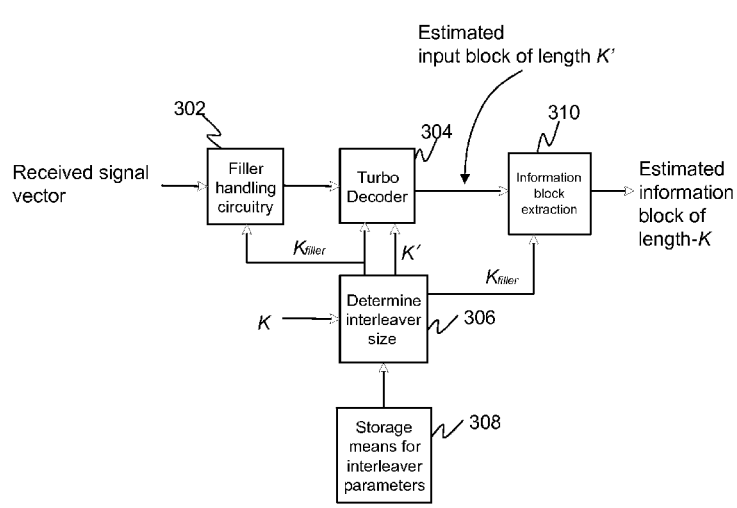
FIG. 3 is a block diagram of a receiver.

FIG. 3 is a block diagram of the receiver 300. At the input, the filler handling circuitry 302 receives a signal vector which may have been transmitted through the channel, e.g., over-the-air. Circuitry 306 then determines the interleaver size K' which can be done in a similar fashion as discussed above, for example by performing a table lookup from storage 308, or via calculations such as (7), (8) and (2). Therefore, given the information block size K, the decoder 304 uses the same interleaver size K' that was used by the encoder 101. Filler handling circuitry 302 is used to appropriately process received signal vector and the filler bits positions (e.g., if filler bit positions are known, then the corresponding LLR magnitudes can be set to very high magnitudes during decoding). Then turbo decoder 304 performs decoding and obtains an estimate û of the input block of length K'. Finally the information block extraction circuitry 310 extracts an estimated information block from û. Though the filler handling circuitry 302 is shown outside the turbo decoder for ease of explanation, these two can be combined in implementation.

Figure 4:
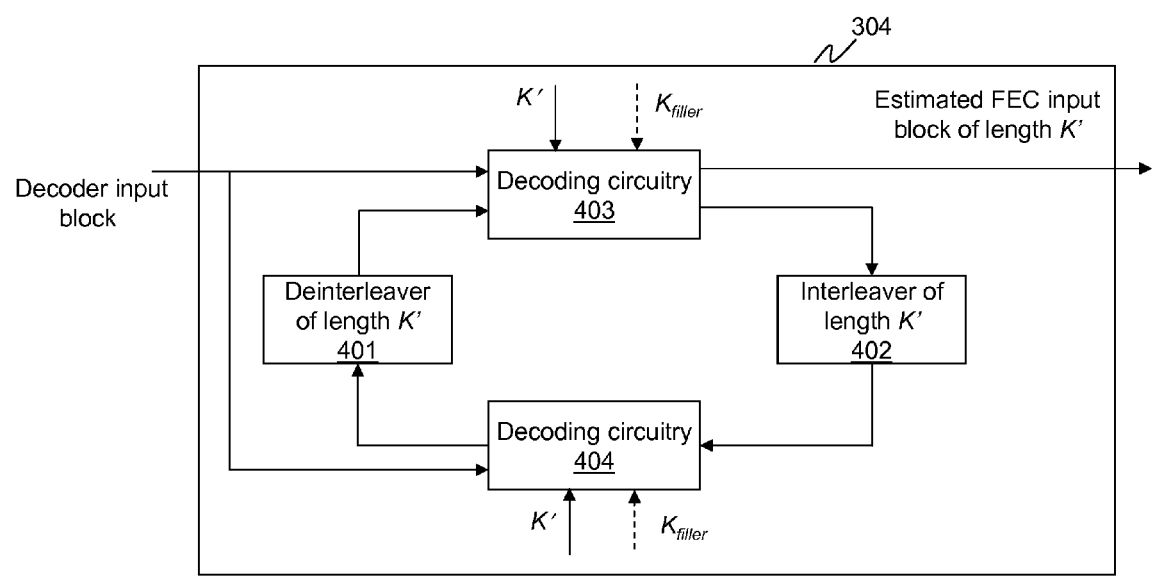
FIG. 4 is a block diagram of the turbo decoder of FIG. 4.

FIG. 4 is a block diagram of the turbo decoder of FIG. 3. As is evident, interleaver 402 and de-interleaver 401 exist between decoding circuitry 403 and decoding circuitry 404. Iterative decoding takes place as known in the art, however, unlike prior-art decoders, interleaver size K' is related to K" where K" is from a set of sizes; wherein the set of sizes comprise K"=$a^p \times f$, $p_{min} \leq p \leq p_{max}$; $f_{min} \leq f \leq f_{max}$, wherein a is an integer and f is a continuous integer between $f_{min}$ and $f_{max}$, p takes integer values between $p_{min}$ and $p_{max}$, a>1, $p_{max}>p_{min}$, $p_{min}>1$. Parameter $K_{filler}$ may or may not be needed by the turbo decoder 304, thus labeled as dashed line in FIG. 4.

As discussed above, in one embodiment K'=K". In yet another embodiment K'=K" when K" is not a multiple of ($2^m-1$); otherwise using K'=K"+δ(K") is a multiple of ($2^m-1$), wherein m is the memory length of a constituent convolutional encoder, and δ(K") is a small positive or negative integer not equal to a multiple of ($2^m-1$) In one embodiment, m=3.

Interleaver 402 may utilize permutation π(i)=($iP_0$+A+d(i)) mod K', where 0≤i≤K'-1 is the sequential index of the symbol positions after interleaving, π(i) is the symbol index before interleaving corresponding to position i, K' is the interleaver size in symbols, $P_0$ is a number that is relatively prime to K', A is a constant, C is a small number that divides K', and d(i) is a dither vector of the form d(i)=β(i mod C)+$P_0 \times α$(i mod C) where α(·) and β(·) are vectors each of length C, periodically applied for 0≤i≤K'-1. The values of K', C, $P_0$, α(·) and β(·) are preferably taken from a row of Table 1. The deinterleaver 401 performs an inverse function of interleaver 402.

Interleaver 402 may utilize permutation π(i)=($f_1 \times i + f_2 \times i^2$) mod K', where 0≤i≤K'-1 is the sequential index of the symbol positions after interleaving, π(i) is the symbol index before interleaving corresponding to position i, K' is the interleaver size in symbols, and $f_1$ and f2 are the factors defining the interleaver. The values of K', $f_1$, $f_2$ are preferably taken from a row of Table 2. The deinterleaver 401 performs an inverse function of interleaver 402.

Figure 5:
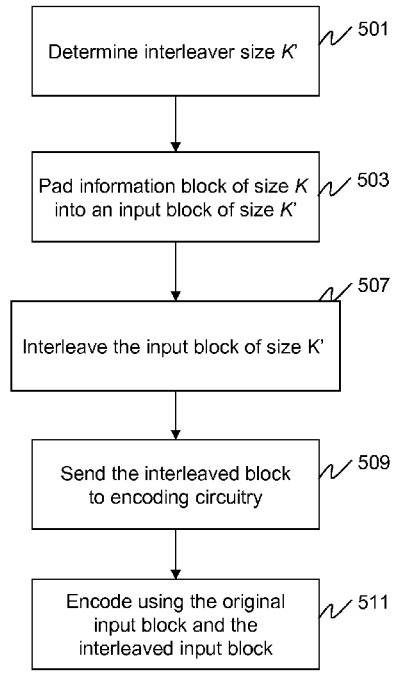
FIG. 5 is a flow chart showing operation of the transmitter of FIG. 1.

FIG. 5 is a flow chart showing operation of the transmitter 100. The logic flow begins at step 501 where circuitry 103 determines interleaver size K' that is related to K" where K" is from a set of sizes; wherein the set of sizes comprise K"=$a^p \times f$, $p_{min} \leq p \leq p_{max}$; $f_{min} \leq f \leq f_{max}$, wherein a is an integer, f is a continuous integer between $f_{min}$ and $f_{max}$, p takes integer values between $p_{min}$ and $p_{max}$, a>1, $p_{max}>p_{min}$, $p_{min}>1$. As discussed above, in one embodiment K'=K". In yet another embodiment K'=K" when K" is not a multiple of ($2^m-1$); otherwise using K'=K"δ(K") when K" is not a multiple of ($2^m-1$), wherein m is the memory length of a constituent convolutional encoder, and δ(K") is a small positive or negative integer not equal to a multiple of ($2^m-1$). In one embodiment, m=3.

At step 503 filler insertion circuitry 109 receives an information block of size K and pads the information block of size K into an input block u of size K' and outputs the input block u. Interleaver 201 then interleaves the input block of size K' (step 507) (preferably using a contention-free interleaver) and sends the interleaved block of size K' to encoding circuitry 203 (step 509). Finally, at step 511, the original input block and interleaved input block are encoded.

As discussed above, the step of interleaving the input block may comprise the step of using a permutation $\pi(i)=(iP_0+A+d(i))\mod K'$, where $0\leq i\leq K'-1$ is the sequential index of the bit positions after interleaving, $7E(i)$ is the bit index before interleaving corresponding to position i, K' is the interleaver size in bits, $P_0$ is a number that is relatively prime to K', A is a constant, C is a small number that divides K' and d(i) is a dither vector of the form $d(i)=\beta(i \mod C)+P_0\times\alpha(i \mod C)$ where $\alpha(\cdot)$ and $\beta(\cdot)$ are vectors each of length C, periodically applied for $0\leq i\leq K'-1$. The values of K', C, $P_0$, $\alpha(\cdot)$ and $\beta(\cdot)$ are preferably taken from Table 1. The step of interleaving the input block may also comprise the step of using a permutation $\pi(i)=(f_1\times i+f_2\times i^2)\mod K'$, where $0\leq i\leq K'-1$ is the sequential index of the symbol positions after interleaving, $\pi(i)$ is the symbol index before interleaving corresponding to position i, K' is the interleaver size in symbols, and $f_1$ and $f_2$ are the factors defining the interleaver. The values of K', $f_1$, $f_2$ are preferably taken from a row of Table 2.

Figure 6:
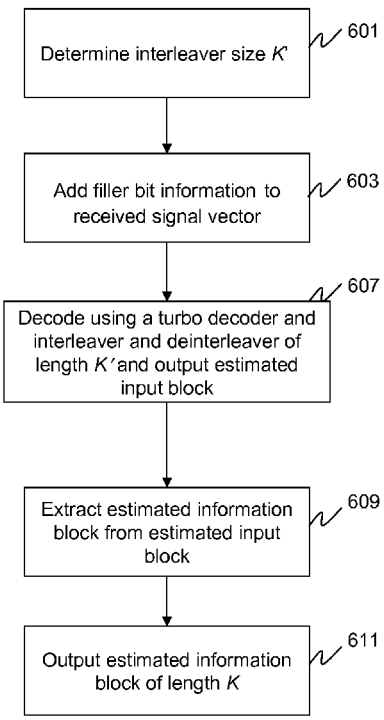
FIG. 6 is a flow chart showing operation of the receiver of FIG. 3.

FIG. 6 is a flow chart showing operation of the receiver of FIG. 3. The logic flow begins at step 601 where circuitry 306 determines the interleaver size K'. At Step 603, Circuitry 302 adds the filler bit information to the received signal vector, for example, if the filler bits and filler bit positions are known circuitry 302 may set to high magnitudes the Log Likelihood Ratios (LLRs) of those positions in the turbo decoder input. At step 607 turbo decoder decodes the decoder input block using interleaver and de-interleaver of size K' and outputs an estimated û of the input block of length K'. At step 609 information block extraction circuitry 310 removes filler bits to obtain an estimate of the information block of length K. Finally at Step 611, the estimated information block is output.

While the invention has been particularly shown and described with reference to a particular embodiment, it will be understood by those skilled in the art that various changes in form and details may be made therein without departing from the spirit and scope of the invention. In one example, the interleaver table may be enhanced further to handle special cases, including: (a) Using an additional set of interleaver sizes defined to cover any special block sizes that must be handled, e.g., without filler bits or with fewer filler bits. (b) The interleaver sizes can be slightly adjusted by adding or subtracting a small value from the semilog slice sizes. In another example, although the invention has been described above assuming binary-input turbo encoder, the same principle can be applied when the turbo encoder takes symbols as input. For example, a duo-binary turbo code takes a symbol of two binary bits at a time, and the turbo interleaver permutes symbols (further scrambling such as alternating the bits within a symbol may be performed). In such a case, the input block size is measured in symbols, and the interleaver size is equal to the number of symbols in the input block. In another example, although the above description assumes that the interleaver sizes and the interleaver parameters are stored in a look-up table, it is possible that they may be determined via other means such as algebraic calculation. In yet another example, although the above description assumes a turbo code, the method is also applicable to other FEC schemes including, for example, low-density parity-check (LDPC) codes, Reed-Solomon (RS) Codes, etc. It is intended that such changes come within the scope of the following claims.

The invention claimed is:

1. A method for operating a turbo encoder, the method comprising the steps of:

receiving an information block of size K;

determining an interleaver size K' equal to K" where K" is from a set of sizes; wherein the set of sizes comprise $K''=a^p\times f$, $p_{min}\leq p\leq p_{max}$, $f_{min}\leq f\leq f_{max}$, wherein a is an integer, f is a continuous integer between $f_{min}$ and $f_{max}$, p takes integer values between $p_{min}$ and $p_{max}$, $a>1$, $p_{max}>p_{min}$, $p_{min}>1$;

padding the information block of size K into an input block of size K'; and interleaving the input block using an interleaver of size K', wherein the step of interleaving the input block comprises the step of using a permutation $\pi(i)=(f_1\times i+f_2\times i^2)\mod K'$, where $0\leq i\leq K'-1$ is a sequential index of symbol positions after interleaving, $\pi(i)$ is a symbol index before interleaving corresponding to position i, K' is an interleaver size in symbols, and $f_1$ and $f_2$ are factors defining the interleaver;

encoding the original input block and the interleaved input block to obtain a codeword block; and transmitting the codeword block through the channel.

2. The method of claim 1 wherein the values of K', $f_1$, $f_2$ are taken from at least one row of the following table:

| K' | $f_1$ | $f_2$ |
|---|---|---|
| 40 | 37 | 20 |
| 56 | 19 | 42 |
| 72 | 19 | 60 |
| 88 | 5 | 22 |
| 104 | 45 | 26 |
| 120 | 103 | 90 |
| 136 | 19 | 102 |
| 152 | 135 | 38 |
| 168 | 101 | 84 |
| 192 | 85 | 24 |
| 216 | 13 | 36 |
| 248 | 33 | 62 |
| 280 | 103 | 210 |
| 320 | 21 | 120 |
| 368 | 25 | 138 |
| 384 | 25 | 240 |
| 416 | 77 | 52 |
| 472 | 175 | 118 |
| 544 | 35 | 68 |
| 624 | 41 | 234 |
| 704 | 155 | 44 |
| 800 | 207 | 80 |
| 912 | 85 | 114 |
| 1056 | 229 | 132 |
| 1184 | 217 | 148 |
| 1344 | 211 | 252 |
| 1536 | 71 | 48 |
| 1728 | 127 | 96 |
| 1984 | 185 | 124 |
| 2240 | 209 | 420 |
| 2304 | 253 | 216 |
| 2560 | 39 | 240 |
| 2944 | 231 | 184 |
| 3328 | 51 | 104 |
| 3776 | 179 | 236 |
| 4096 | 95 | 192 |
| 4352 | 477 | 408 |
| 4992 | 233 | 312 |
| 5632 | 45 | 176 |
| 6144 | 263 | 480 |
| 7296 | 137 | 456 |
| 8192 | 417 | 448. |

3. A method for operating a turbo encoder, the method comprising the steps of:

receiving an input block of size K'; and encoding the input block using an interleaver of size K' and a permutation $\pi(i)=(iP_0+A+d(i))\mod K'$, where $0\leq i\leq K'-1$ is a sequential index of bit positions after interleaving, $\pi(i)$ is a bit index before interleaving corresponding to position i, $P_0$ is a number that is relatively prime to K', A is a constant, C is a small number that divides K', and d(i) is a dither vector of the form d(i)=β(i mod C)+P₀×α(i mod C) where α(·) and β(·) are vectors each of length C, periodically applied for 0≤i≤K'−1 and wherein α(·) and β(·) are taken from a set of allowed α(·) and β(·) values.

4. The method of claim 3 wherein vector α(·) of a given interleaver of size K' is taken from a set of allowed α(·) vectors using an index a.

5. The method of claim 3 wherein vector β(·) of a given interleaver of size K' is taken from a set of allowed β(·) vectors using an index b.

6. A method for operating a turbo encoder, the method comprising the steps of:
receiving an input block of size K'; and
encoding the input block using an interleaver of size K' and a permutation $\pi(i)=(f_1 \times i + f_2 \times i^2) \bmod K'$, where $0 \leq i \leq K'-1$ comprise the sequential index of symbol positions after interleaving, $\pi(i)$ is a symbol index before interleaving corresponding to position i, K' is an interleaver size in symbols, and $f_1$ and $f_2$ are factors defining the interleaver and wherein values of K', $f_1$, $f_2$ are taken from at least one row of the following table:

| K' | $f_1$ | $f_2$ |
|---|---|---|
| 40 | 37 | 20 |
| 56 | 19 | 42 |
| 72 | 19 | 60 |
| 88 | 5 | 22 |
| 104 | 45 | 26 |
| 120 | 103 | 90 |
| 136 | 19 | 102 |
| 152 | 135 | 38 |
| 168 | 101 | 84 |
| 192 | 85 | 24 |
| 216 | 13 | 36 |
| 248 | 33 | 62 |
| 280 | 103 | 210 |
| 320 | 21 | 120 |
| 368 | 25 | 138 |
| 384 | 25 | 240 |
| 416 | 77 | 52 |
| 472 | 175 | 118 |
| 544 | 35 | 68 |
| 624 | 41 | 234 |
| 704 | 155 | 44 |
| 800 | 207 | 80 |
| 912 | 85 | 114 |
| 1056 | 229 | 132 |
| 1184 | 217 | 148 |
| 1344 | 211 | 252 |
| 1536 | 71 | 48 |
| 1728 | 127 | 96 |
| 1984 | 185 | 124 |
| 2240 | 209 | 420 |
| 2304 | 253 | 216 |
| 2560 | 39 | 240 |
| 2944 | 231 | 184 |
| 3328 | 51 | 104 |
| 3776 | 179 | 236 |
| 4096 | 95 | 192 |
| 4352 | 477 | 408 |
| 4992 | 233 | 312 |
| 5632 | 45 | 176 |
| 6144 | 263 | 480 |
| 7296 | 137 | 456 |
| 8192 | 417 | 448. |

7. An apparatus for operating a turbo encoder, the apparatus comprising:
a receiving circuitry that receives an input block of size K'; and
an encoder that encodes the input block using an interleaver of size K' and a permutation $\pi(i)=(f_1 \times i + f_2 \times i^2) \bmod K'$, where $0 \leq i \leq K'-1$ is a sequential index of symbol positions after interleaving, $\pi(i)$ comprises a symbol index before interleaving corresponding to position i, K' is an interleaver size in symbols, and $f_1$ and $f_2$ are factors defining the interleaver and wherein values of K', $f_1$, $f_2$ are taken from at least one row of the following table:

| K' | $f_1$ | $f_2$ |
|---|---|---|
| 40 | 37 | 20 |
| 56 | 19 | 42 |
| 72 | 19 | 60 |
| 88 | 5 | 22 |
| 104 | 45 | 26 |
| 120 | 103 | 90 |
| 136 | 19 | 102 |
| 152 | 135 | 38 |
| 168 | 101 | 84 |
| 192 | 85 | 24 |
| 216 | 13 | 36 |
| 248 | 33 | 62 |
| 280 | 103 | 210 |
| 320 | 21 | 120 |
| 368 | 25 | 138 |
| 384 | 25 | 240 |
| 416 | 77 | 52 |
| 472 | 175 | 118 |
| 544 | 35 | 68 |
| 624 | 41 | 234 |
| 704 | 155 | 44 |
| 800 | 207 | 80 |
| 912 | 85 | 114 |
| 1056 | 229 | 132 |
| 1184 | 217 | 148 |
| 1344 | 211 | 252 |
| 1536 | 71 | 48 |
| 1728 | 127 | 96 |
| 1984 | 185 | 124 |
| 2240 | 209 | 420 |
| 2304 | 253 | 216 |
| 2560 | 39 | 240 |
| 2944 | 231 | 184 |
| 3328 | 51 | 104 |
| 3776 | 179 | 236 |
| 4096 | 95 | 192 |
| 4352 | 477 | 408 |
| 4992 | 233 | 312 |
| 5632 | 45 | 176 |
| 6144 | 263 | 480 |
| 7296 | 137 | 456 |
| 8192 | 417 | 448 |

| K' | $f_1$ | $f_2$ | |
|---|---|---|---|
| 40 | 37 | 20 | 1,2,4,5,8,10,20 |
| 56 | 19 | 42 | 1,2,4,7,8,14,28 |
| 72 | 19 | 60 | 1,2,3,4,6,8,9,12,18,24 |
| 88 | 5 | 22 | 1,2,4,8,11,22 |
| 104 | 45 | 26 | 1,2,4,8,13,26 |
| 120 | 103 | 90 | 1,2,3,4,5,6,8,10,12,15,20,24,30 |
| 136 | 19 | 102 | 1,2,4,8,17 |
| 152 | 135 | 38 | 1,2,4,8,19 |
| 168 | 101 | 84 | 1,2,3,4,6,7,8,12,14,21,24,28 |
| 192 | 85 | 24 | 1,2,3,4,6,8,12,16,24,32 |
| 216 | 13 | 36 | 1,2,3,4,6,8,9,12,18,24,27 |
| 248 | 33 | 62 | 1,2,4,8,31 |
| 280 | 103 | 210 | 1,2,4,5,7,8,10,14,20,28 |
| 320 | 21 | 120 | 1,2,4,5,8,10,16,20,32 |
| 368 | 25 | 138 | 1,2,4,8,16,23 |
| 384 | 25 | 240 | 1,2,3,4,6,8,12,16,24,32 |
| 416 | 77 | 52 | 1,2,4,8,13,16,26,32 |
| 472 | 175 | 118 | 1,2,4,8 |
| 544 | 35 | 68 | 1,2,4,8,16,17,32 |
| 624 | 41 | 234 | 1,2,3,4,6,8,12,13,16,24,26 |

| K' | $f_1$ | $f_2$ | |
|---|---|---|---|
| 704 | 155 | 44 | 1,2,4,8,11,16,22,32 |
| 800 | 207 | 80 | 1,2,3,4,6,8,12,16,19,24 |
| 912 | 85 | 114 | 1,2,3,4,6,8,11,12,16,22,24,32 |
| 1056 | 229 | 132 | 1,2,4,8,16,32 |
| 1184 | 217 | 148 | 1,2,3,4,6,7,8,12,14,16,21,24,28,32 |
| 1344 | 211 | 252 | 1,2,3,4,6,8,12,16,24,32 |
| 1536 | 71 | 48 | 1,2,3,4,6,8,9,12,16,18,24,28,32 |
| 1728 | 127 | 96 | 1,2,3,4,68,12,16,24,32 |
| 1984 | 185 | 124 | 1,2,3,4,6,8,9,12,16,18,24,27,32 |
| 2240 | 209 | 420 | 1,2,4,8,16,32,32 |
| 2304 | 253 | 216 | 1,2,4,5,7,8,10,14,16,20,28,32 |
| 2560 | 39 | 240 | 1,2,3,4,6,8,9,12,16,18,24,32 |
| 2944 | 231 | 184 | 1,2,4,5,8,10,16,20,32 |
| 3328 | 51 | 104 | 1,2,4,8,13,16,26,32 |
| 3776 | 179 | 236 | 1,2,4,8,16,32 |
| 4096 | 95 | 192 | 1,2,4,8,16,32 |
| 4352 | 477 | 408 | 1,2,4,8,16,17,32 |
| 4992 | 233 | 312 | 1,2,3,4,6,8,12,13,16,24,26,32 |
| 5632 | 45 | 176 | 1,2,4,8,11,16,22,32 |
| 6144 | 263 | 480 | 1,2,3,4,6,8,12,16,24,32 |
| 7296 | 137 | 456 | 1,2,3,4,6,8,12,16,19,24,32 |
| 8192 | 417 | 448 | 1,2,4,8,16,32. |

\* \* \* \* \*